United States Patent
Li et al.

(10) Patent No.: US 6,730,198 B2
(45) Date of Patent: *May 4, 2004

(54) CONTAINER-SHAPED PHYSICAL VAPOR DEPOSITION TARGETS

(75) Inventors: Jianxing Li, Spokane, WA (US); Michael R. Pinter, Spokane, WA (US); Steven Wu, Spokane, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/223,806

(22) Filed: Aug. 19, 2002

(65) Prior Publication Data

US 2003/0015432 A1 Jan. 23, 2003

Related U.S. Application Data

(63) Continuation of application No. 09/687,946, filed on Sep. 13, 2000, now Pat. No. 6,482,302.

(51) Int. Cl.⁷ ............................................. C23C 14/34
(52) U.S. Cl. ................................................ 204/298.13
(58) Field of Search ........................ 204/298.12, 298.13

(56) References Cited

U.S. PATENT DOCUMENTS

| | | | |
|---|---|---|---|
| 4,246,088 A | 1/1981 | Murphy et al. | 204/181 R |
| 5,853,816 A | 12/1998 | Vanderstraeten | 427/452 |
| 6,140,570 A | 10/2000 | Kariya | 136/256 |
| 6,283,357 B1 | 9/2001 | Kulkarni et al. | 228/155 |
| 6,482,302 B1 * | 11/2002 | Li et al. | 204/298.13 |

FOREIGN PATENT DOCUMENTS

| | | | | |
|---|---|---|---|---|
| EP | 0 500 031 A1 | | 8/1992 | C23C/14/34 |
| GB | 2 049 737 A | | 12/1980 | C23C/15/00 |
| JP | 2000-256843 | | 9/2000 | C23C/14/34 |
| WO | WO 00/32347 | * | 6/2000 | B23K/20/00 |

OTHER PUBLICATIONS

Niemczyk, T. et al., "Preparation of Cathodes for Use in Demountable Hollow Cathode Lamps", Appl. Spectroscopy. vol. 33, No. 1, Jan.–Feb. 1979, pp. 61–62.

Ashtiani, K. et al., "A New Hollow–Cathode Magnetron Source for 0.10 μm Copper Applications", Proceedings of IEEE 2000 Internatl. Interconnect Tech. Conf., Burlingame, CA, Jun. 5–7, 2000, pp. 37–39.

* cited by examiner

*Primary Examiner*—Steven VerSteeg
(74) *Attorney, Agent, or Firm*—Wells St. John P.S.

(57) ABSTRACT

The invention includes container-shaped physical vapor deposition targets having a first conductive material in a container-shape and a second conductive material on an entirety of an exterior surface of the first conductive material. The second conductive material has a different composition than the first conductive material.

8 Claims, 3 Drawing Sheets

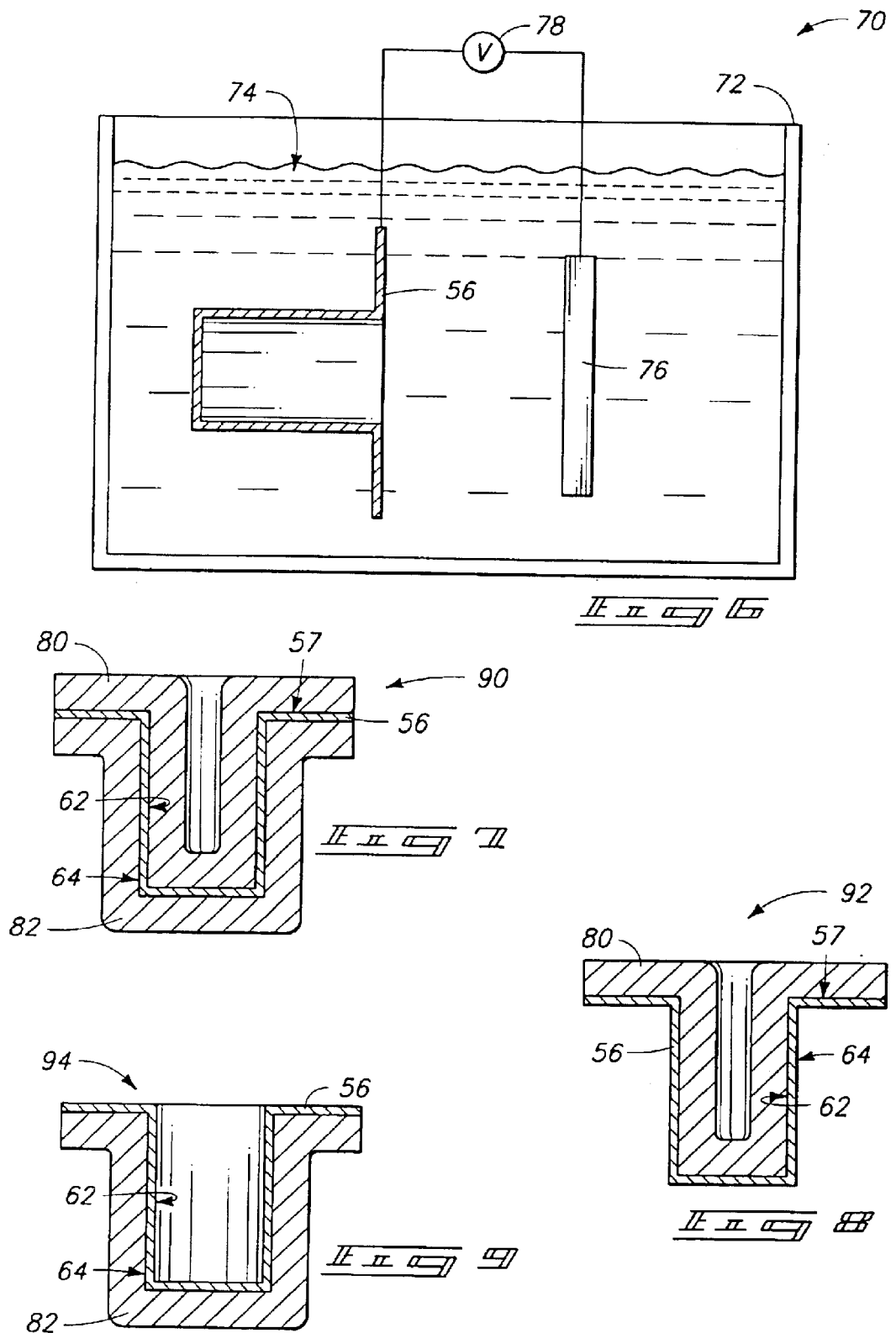

CONTAINER-SHAPED PHYSICAL VAPOR DEPOSITION TARGETS

RELATED PATENT DATA

This patent is a continuation application of U.S. patent application Ser. No. 09/687,946 which was filed on Oct. 13, 2000 now U.S. Pat. No. 6,482,302.

TECHNICAL FIELD

The invention pertains to container-shaped physical vapor deposition targets, and to methods of forming container-shaped physical vapor deposition targets.

BACKGROUND OF THE INVENTION

An exemplary sputtering process utilizing a container-shaped physical vapor deposition target is described with reference to FIG. 1. Specifically, FIG. 1 illustrates a sputtering apparatus 10, having a container-shaped physical vapor deposition target 12 incorporated therein. Apparatus 10 further comprises a substrate holder 14 and a substrate 16 provided on holder 14. Substrate 16 can comprise, for example, a semiconductive material wafer. In operation, atoms and/or ions are displaced from an interior region of target 12 and directed toward substrate 16. The displaced materials are illustrated by arrows 18 in the diagram of FIG. 1. A voltage differential or bias can be provided between target 12 and substrate 16, as shown, to draw charged materials from target 12 to substrate 16. The materials displaced from target 12 are deposited on an upper surface of substrate 16 to form a thin film (not shown) on substrate 16. In an exemplary process, target 12 can comprise copper. Copper ions and/or copper atoms can be sputter-deposited from target 12 onto substrate 16 to form a thin film of copper across an upper surface of substrate 16.

Target 12 is one example of a container-shaped physical vapor deposition target. For purposes of interpreting this disclosure and the claims that follow, a container-shaped physical vapor deposition target is defined as a physical vapor deposition target having a closed-ended cavity extending therein, and wherein a predominate feature of the target is the cavity. For instance, the target 12 of FIG. 10 has a closed-ended cavity 20 extending therein (with the closed-end being labeled 22 in FIG. 1), and cavity 20 is a predominate feature of the target.

FIG. 2 shows a bottom-view (relative to the view of FIG. 1) of target 12, and shows a configuration of target 12 wherein the target comprises a circular outer periphery surrounding cavity 20.

It can be difficult to form container-shaped targets, and accordingly it is desired to develop new methodologies for forming container-shaped targets.

SUMMARY OF THE INVENTION

In one aspect, the invention encompasses a method of forming a container-shaped physical vapor deposition target. A conductive material is provided in a container-shape. The container-shape comprises an interior region and an exterior region, and the conductive material comprises an interior surface along the interior region as well as an exterior surface along the exterior region. A sputtering material is electrolytically deposited on at least one of the interior and exterior surfaces of the container-shaped conductive material.

In another aspect, the invention encompasses a container-shaped physical vapor deposition target. The target includes a first conductive material in a container-shape, with the container-shape comprising an interior region and an exterior region. The first conductive material comprises an interior surface along the interior region of the container-shape and an exterior surface along the exterior region of the container shape. The physical vapor deposition target further includes a second conductive material on an entirety of at least one of the interior and exterior surfaces of the first conductive material, with the second conductive material having at least one different metallurgical property than the first conductive material.

BRIEF DESCRIPTION OF THE DRAWINGS

Preferred embodiments of the invention are described below with reference to the following accompanying drawings.

FIG. 6 is a diagrammatic, cross-sectional view of an electrolysis apparatus utilized in accordance with methodology of the present invention for treating the template of FIG. 5.

FIG. 7 is a diagrammatic, cross-sectional view of the template of FIG. 5 shown after processing in accordance with FIG. 6.

FIG. 8 is a view of the template of FIG. 5 shown after processing in accordance with FIG. 6, and shown in an alternative embodiment relative to that of FIG. 7.

FIG. 9 is a view of the template of FIG. 5 shown after processing in accordance with FIG. 6, and shown in an alternative embodiment relative to that of FIGS. 7 and 8.

DETAILED DESCRIPTION OF THE PREFERRED EMBODIMENTS

Figure 3:
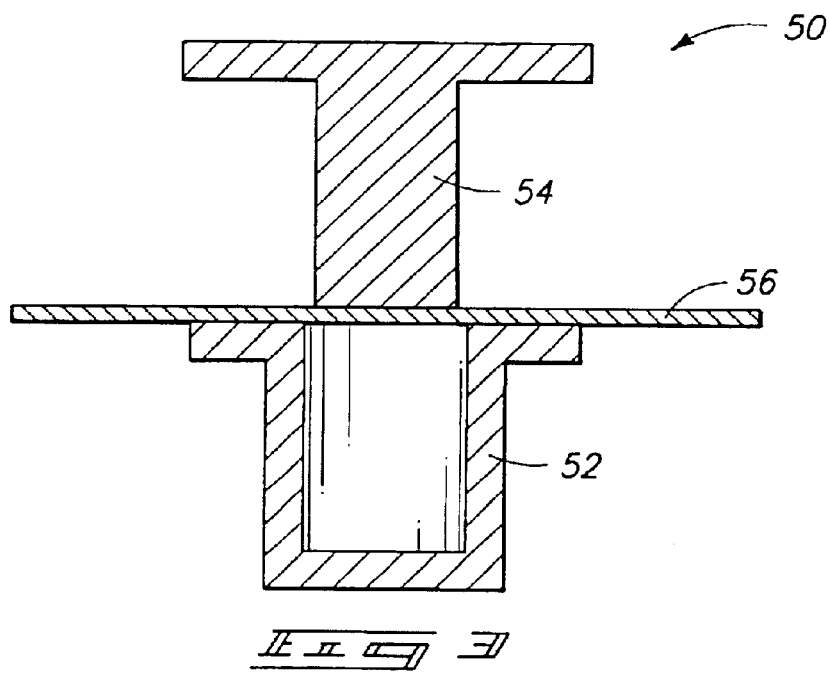
FIG. 3 is a diagrammatic, cross-sectional view of an apparatus utilized in accordance with a method of the present invention for forming a container-shaped physical vapor deposition target.

FIG. 3 illustrates a preliminary step of a method encompassed by the present invention for forming a container-shaped physical vapor deposition target. Specifically, FIG. 3 illustrates an apparatus 50 comprising a bottom mold portion 52 and an upper mold portion 54. FIG. 3 also illustrates a thin sheet of conductive material 56 provided between mold portions 52 and 54. Material 56 can comprise, for example, copper, and can have a thickness of from about 0.01 inch to about 0.1 inch. In particular aspects of the present invention, material 56 can be a high-purity copper foil, with the term "high-purity" indicating a copper material having a purity of greater than or equal to 99.99 atom %. In other aspects of the invention, material 56 can comprise a low-purity copper material, or a conductive steel material, such as, for example, stainless steel.

One or both of mold portions 52 and 54 is connected to a power source configured to displace mold portions 52 and 54 relative to one another, and to accordingly press conductive material 56 into mold portion 52.

Figure 4:
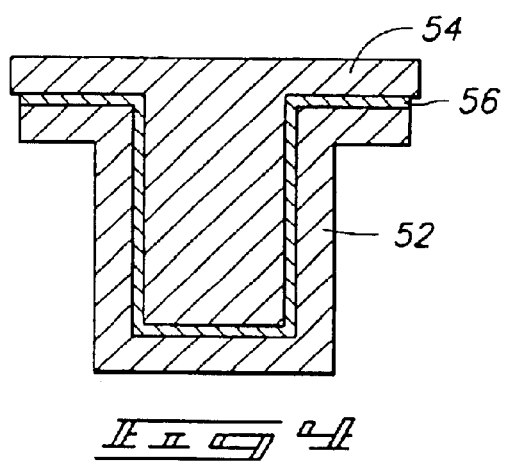
FIG. 4 is a view of the FIG. 3 apparatus shown at a processing step subsequent to that of FIG. 3.

FIG. 4 illustrates apparatus 50 after conductive material 56 has been pressed into mold portion 52. Specifically, conductive material 56 has been pressed into a physical vapor deposition target template configuration.

Figure 1:
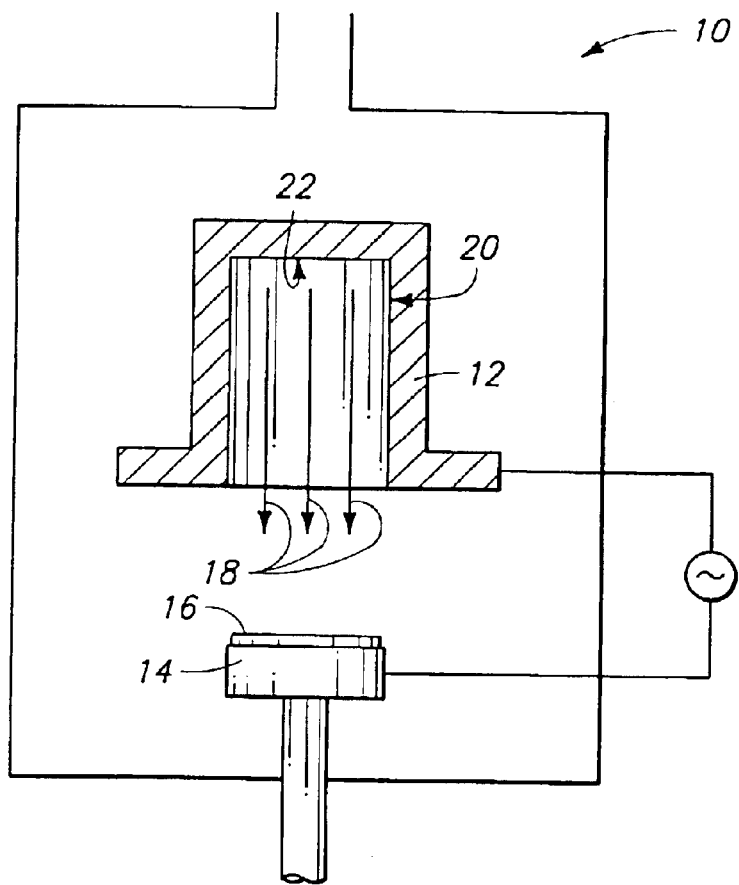
FIG. 1 is a diagrammatic, cross-sectional view of a prior art sputtering apparatus.
Figure 2:
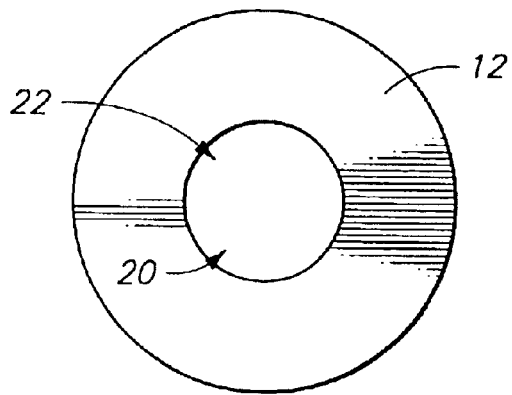
FIG. 2 is a bottom-view of a target utilized in the apparatus of FIG. 1.
Figure 5:
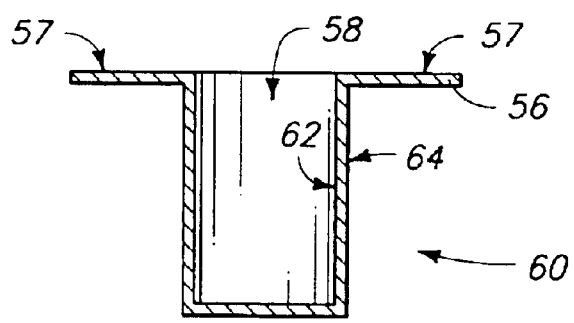
FIG. 5 is a diagrammatic, cross-sectional view of a container-shaped physical vapor deposition target template formed in accordance with methodology of the present invention.

FIG. 5 illustrates conductive material 56 after the material has been pressed in accordance with the methodology of FIGS. 3 and 4, and then removed from the press. The container-shape of conductive material 56 can comprise a round-shape similar to the shape of prior art target 12 (FIGS. 1 and 2). The shown container shape of conductive material 56 comprises an interior region 58 and an exterior region 60; and conductive material 56 comprises an interior surface 62 defining a periphery of interior region 58. Conductive material 56 also comprises an exterior surface 64 extending along exterior region 60. The container-shape additionally comprises a flange 57 extending around interior region 58.

The illustrated container-shape of conductive material 56 is an exemplary shape which can be accomplished utilizing methodology of the present invention. It is to be understood that other container-shapes can also be formed utilizing methodology of the present invention by simply changing the configuration of one or both of molds 52 and 54 (FIGS. 3 and 4). Also, it is to be understood that a conductive material can be formed into a container-shape by methodology other than the processing of FIGS. 3 and 4. Exemplary processing methods for forming a conductive material into a container-shape include spin-forming the container-shape, deep-drawing the container shape, and machining the container-shaped template from a solid piece of conductive material.

Referring next to FIG. 6, sputtering-target template 56 of FIG. 5 is placed in an electrolysis apparatus 70. Apparatus 70 comprises a vessel 72 configured to retain an electrolyte solution 74. Template 56 is provided as a cathode within electrolyte 74, and an anode 76 is also placed within electrolyte 74. Template 56 is electrically connected with anode 76, and a power source 78 is utilized to form a voltage between template 56 and anode 76. The voltage causes an electroplating reaction to occur wherein material from anode 76 is deposited onto template 56. Anode 76 can comprise, for example, one or more of aluminum, copper, titanium, magnesium, tin, tantalum and tungsten. Depending on the voltage utilized and the composition of anode 76, either high-purity single elements can be transferred from anode 76 to template 56, or elemental mixtures and alloys can be transferred from anode 76 to template 56.

FIGS. 7, 8 and 9 illustrate template 56 after the electroplating of FIG. 6, and illustrate alternative embodiments of the electroplating procedure. Specifically, FIG. 7 illustrates a target 90 comprising an embodiment wherein the electroplating forms a conductive material 80 along interior surface 62 of template 56, and also forms a conductive material 82 along exterior surface 64 of template 56. Alternatively, FIG. 8 illustrates a target 92 comprising an embodiment wherein conductive material 80 is formed along interior surface 62, but wherein conductive material is not electrically deposited along exterior surface 64 of template 56. In yet another alternative embodiment, FIG. 9 illustrates a target 94 wherein conductive material 82 is formed along exterior surface 64, but wherein conductive material is not electrically deposited along interior surface 62 of template 56.

One or both of conductive materials 80 and 82 of the embodiments of FIGS. 7–9 can have one or more different metallurgical properties relative to template 56; with the term "metallurgical property" including properties of, for example, composition, grain size distribution and crystallographic orientation distribution. Alternatively, one or both of conductive materials 80 and 82 can have a composition identical to that of template 56.

The embodiment of FIG. 8 can be accomplished by, for example, providing a non-conductive barrier material over exterior surface 64 prior to the electrolytic deposition of FIG. 6, and the embodiment of FIG. 9 can be accomplished by, for example, providing a non-conductive barrier material over interior surface 62 prior to the electrolytic deposition of FIG. 6. Suitable barrier materials include, for example, plastic coatings and tape.

The materials 80 and 82 of FIGS. 7, 8 and 9 can be formed to thicknesses of, for example, from about 0.2 inch to about 0.5 inch. It is noted that the deposited conductive materials 80 and 82 of FIGS. 7, 8 and 9 extend along upper flange 57 of template 56, as well as along interior and exterior regions 62 and 64. Such are exemplary embodiments of the present invention. Conductive materials 80 and 82 can be prevented from extending along flange 57 by providing an insulative barrier layer (such as plastic) along flange 57 during the electrolysis of FIG. 6.

Referring again to FIG. 7, the electrically deposited conductive material 82 is identical in composition to deposited material 80, and can comprise, for example, one or more elements selected from the group consisting of aluminum, copper, titanium, magnesium, tin, tantalum and tungsten. In a particular embodiment, template 56 comprises a copper material having a first purity of copper, and conductive layers 80 and 82 comprise electrolytically deposited copper having a higher copper purity than template 56. For instance, template 56 can comprise a copper material having a purity of less than or equal to 99.9 atom % copper, and electrolytically deposited materials 80 and 82 can comprise a copper purity in excess of 99.99 atom %. If material 80 has a substantially higher copper purity than template 56, it can be desired to utilize material 80 as the sole sputtered component of target 90, and accordingly it can be desired to form material 80 to sufficient thickness so that template 56 will not be exposed during a sputtering operation. In another aspect, template 56 can comprise a high-purity copper material, having a purity equal to or greater than that of electrolytically deposited materials 80 and 82. In such aspect, template 56 can be utilized in a sputtering operation. Accordingly, target 90 can be exposed to sufficient sputtering so that the sputtering wears through material 80, and into or through material 56, and into material 82. Such can enable a target to be formed having a lifetime greater than would a target in which only material 80 can be effectively sputtered. If template 56 is to be sputtered, it can be desired that template 56 have a purity that is at least equal to the purity of conductive material 80. For instance, in applications wherein target 90 is a copper-comprising physical vapor deposition target it can be desired that both conductive material 80 and template 56 have a copper purity exceeding 99.99 atom %.

In yet another aspect of the invention, materials 80 and 82 can predominately comprise different elements than does template 56. For instance, template 56 can predominately comprise copper, and materials 80 and 82 can predominately comprise one or more elements selected from the group consisting of aluminum, titanium, magnesium, tin, tantalum and tungsten. Alternatively, conductive template 56 can comprise steel, and materials 80 and 82 can comprise one or more of aluminum, copper, titanium, magnesium, tin, tantalum and tungsten. For purposes of interpreting this disclosure and the claims that follow, a material is to be understood to "predominately comprise" a particular element if the majority element in the material is the particular element. For instance, a material can predominately comprise copper if copper is present in the material to 30 atom %, and if no other element is present in the material to a concentration of equal to or greater than 30 atom %.

Referring next to the target 92 of FIG. 8, such can be a preferable construction in embodiments in which template 56 comprises a material different from conductive material 80, and specifically in which template 56 comprises a material which is not to be sputtered during sputter deposition of material 80. Target 92 differs from target 90, in that the conductive material 82 (FIG. 7) has not been electrolytically deposited on outer surface 64 of template 56. In embodiments in which sputtering is intended not to proceed through template 56, it can be desired to avoid forming conductive material 82 (FIG. 7) on exterior surface 64. For instance, since conductive material 82 will not be sputter-deposited, it could be economically wasteful to form material 82 on the exterior surface 64 of template 56.

Another aspect of the invention in which it can be preferential to utilize the embodiment of FIG. 8, rather than that of FIG. 7, is an embodiment in which material 80 is to have a different composition than the material 82 of FIG. 7. In such methodology, a second material 82 can be formed over exterior surface 64 after formation of material 80, and such second material can have a different composition than material 80.

Referring next to the target 94 of FIG. 9, such can be a preferable construction in embodiments in which template 56 comprises a material which is to be sputtered during sputter deposition of target 94. Target 94 differs from targets 90 and 92 (FIGS. 7 and 8, respectively), in that the material template 56 will be the first material sputtered from target 94. In contrast, the first material sputtered from targets 90 and 92 is electrodeposited material 80.

One of the differences between methodology of the present invention relative to prior art methodology for forming container-shaped physical vapor deposition targets is that the methodology of the present invention can utilize electroplating to form a sputtering portion of a physical vapor deposition target (such as, for example, to form portion 80 of the target 90 of FIG. 7). Prior art methodology for forming container-shaped physical vapor deposition targets would be to effectively use methodology comparable to that of FIGS. 3 and 4 to press an entirety of a physical vapor deposition target into a container-shape. Such would encompass utilizing a thicker material than the material 56 described with reference to FIGS. 3 and 4, such as, for example, utilizing a material having a thickness of about 0.5 inch or greater. It can be difficult to press such thick materials, in that strain can be introduced at corners and edges of the thick materials during pressing, which can affect grain size and crystallographic orientations within the materials.

Methodology of the present invention can enable thinner materials to be pressed, such as, for example, thin foils. It is easier to press thin foils in that lower pressures can be utilized, and in that the foils are significantly more deformable than thicker materials. Accordingly, methodology of the present invention can avoid problems associated with the prior art pressing of thicker materials. Further, methodology of the present invention can enable a pressed target template to be utilized as a support structure for holding a material which is to be sputtered, rather than as itself being the material which is to be sputtered. Accordingly, if defects are introduced into a template material, such defects will not disrupt sputtering from a target comprising a template, in that the template is itself not actually sputtered.

The above-discussed aspects of the present invention can enable lower purity template materials, and/or lower cost template materials to be utilized than could be utilized in prior art methodologies. Of course, it is to be understood that the invention also encompasses methodologies in which a physical vapor deposition target template is utilized as a sputtered material. In such aspects, methodology of the invention can be advantageous over prior art methodologies in that the physical vapor deposition target template can be thin, and accordingly easily deformable. Such can enable a physical vapor deposition target template to be pressed into a container-shape without introducing grain size disparities or alterations in crystallographic orientations during the pressing operation.

A difficulty that can occur in methodology of the present invention is that thin foils of conductor material may not be rigid enough to hold a template shape during electroplating of conductive material on the template. Such difficulty can be overcome by utilizing thicker template materials. Another method for overcoming the difficulty is to utilize a conductive template material which is in a easily deformable state during pressing of the material into a container shape, and which can then be transformed into a more rigid state after the pressing operation. For instance, if the conductive material 56 of FIGS. 3 and 4 comprises copper, the material can be formed of a copper/tin composition. Such composition can, for example, comprise tin up to a concentration of about 2 atom % within a copper matrix. If the tin is completely dissolved in the copper matrix, the copper template will have a ductility which is relatively high, and which renders the material excellent for deformability and formation of a container-shape. Once the conductive material is formed into a container-shape, it can be heat-treated, and allowed to cool slowly. The tin will then leave the copper matrix, which will transform the copper material into a more rigid structure. The tin can initially be dispersed within the copper matrix by forming a tin/copper composition at an elevated temperature, and then rapidly quenching the composition to a cool temperature which traps tin within the copper matrix.

The embodiments of the invention described herein are exemplary embodiments, and it is to be understood that the invention encompasses other embodiments in addition to those specifically shown. For instance, other container-shapes can be formed in accordance with the present invention in addition to the specifically illustrated shapes.

What is claimed is:

1. A container-shaped physical vapor deposition target, comprising:
    a first conductive material in a container-shape, the container-shape comprising an interior region and an exterior region; the first conductive material comprising an interior surface along the interior region of the container-shape and an exterior surface along the exterior region of the container-shape;
    a second conductive material on an entirety of the exterior surface of the first conductive material, the second conductive material being a different composition than the first conductive material;
    wherein the first conductive material comprises a thickness of from about 0.01 inch to about 0.1 inch;
    wherein the second conductive material comprises a thickness of from about 0.2 inch to about 1 inch;
    wherein the first conductive material comprises copper; and wherein the second conductive material comprises one or more elements selected from the group consisting of Al, Ti, Mg, Sn, Ta and W.

2. The physical vapor deposition target of claim 1 wherein the second conductive material comprises a thickness of from about 0.2 inch to about 0.5 inch.

3. The physical vapor deposition target of claim 1 wherein the second conductive material comprises Al.

4. The physical vapor deposition target of claim 1 wherein the second conductive material comprises Ti.

5. The physical vapor deposition target of claim 1 wherein the second conductive material comprises Mg.

6. The physical vapor deposition target of claim 1 wherein the second conductive material comprises Sn.

7. The physical vapor deposition target of claim 1 wherein the second conductive material comprises Ta.

8. The physical vapor deposition target of claim 1 wherein the second conductive material comprises W.

* * * * *

UNITED STATES PATENT AND TRADEMARK OFFICE
CERTIFICATE OF CORRECTION

PATENT NO. : 6,730,198 B2
DATED : May 4, 2004
INVENTOR(S) : Jianxing Li et al.

It is certified that error appears in the above-identified patent and that said Letters Patent is hereby corrected as shown below:

Title page,
Item [56], References Cited, FOREIGN PATENT DOCUMENTS, insert
-- PCT Search Report US01/32019 --

Signed and Sealed this

Twenty-fifth Day of January, 2005

JON W. DUDAS
*Director of the United States Patent and Trademark Office*